(12) United States Patent
Mok et al.

(10) Patent No.: US 10,243,026 B2
(45) Date of Patent: Mar. 26, 2019

(54) DISPLAY DEVICE (71) Applicant: Samsung Display Co., Ltd., Yongin-si, Gyeonggi-Do (KR)

(72) Inventors: Rang-Kyun Mok, Seoul (KR); Yi-Joon Ahn, Seoul (KR)

(73) Assignee: Samsung Display Co., Ltd. (KR)

( * ) Notice: Subject to any disclaimer, the term of this patent is extended or adjusted under 35 U.S.C. 154(b) by 109 days.

(21) Appl. No.: 15/237,001

(22) Filed: Aug. 15, 2016

(65) Prior Publication Data
US 2017/0199400 A1 Jul. 13, 2017

(30) Foreign Application Priority Data
Jan. 8, 2016 (KR) .................. 10-2016-0002890

(51) Int. Cl.
*H01L 27/32* (2006.01)
*G02F 1/01* (2006.01)
*G02F 1/1343* (2006.01)
*G02F 1/1362* (2006.01)
*G02F 1/1335* (2006.01)
*G02F 1/1368* (2006.01)

(52) U.S. Cl.
CPC ........ *H01L 27/3232* (2013.01); *G02F 1/0147* (2013.01); *G02F 1/134336* (2013.01); *G02F 1/136286* (2013.01); *H01L 27/326* (2013.01); *H01L 27/3276* (2013.01); *G02F 1/1368* (2013.01); *G02F 1/13439* (2013.01); *G02F 1/133512* (2013.01); *G02F 1/133514* (2013.01); *G02F 2201/121* (2013.01); *G02F 2201/123* (2013.01); *G02F 2203/60* (2013.01)

(58) Field of Classification Search
CPC ........ G02F 1/0147; G02F 1/19; G02F 1/0105; G02F 1/0107; G02B 27/2278
See application file for complete search history.

(56) References Cited

U.S. PATENT DOCUMENTS

| | | | | |
|---|---|---|---|---|
| 7,630,233 | B2 * | 12/2009 | Kato | G06K 19/0723 365/145 |
| 2004/0041761 | A1 * | 3/2004 | Sugita | G09G 3/3648 345/87 |
| 2007/0194323 | A1 * | 8/2007 | Takano | B82Y 10/00 257/72 |
| 2008/0042180 | A1 * | 2/2008 | Yamazaki | B82Y 10/00 257/306 |
| 2009/0061721 | A1 * | 3/2009 | Isa | H01L 27/1214 445/24 |
| 2010/0182282 | A1 * | 7/2010 | Kurokawa | G02F 1/13338 345/175 |
| 2011/0084273 | A1 * | 4/2011 | Yamazaki | H01L 29/42384 257/43 |

(Continued)

FOREIGN PATENT DOCUMENTS

KR 10-2015-0040065 A 4/2015

*Primary Examiner* — Hoan C Nguyen
(74) *Attorney, Agent, or Firm* — Innovation Counsel LLP (57) ABSTRACT A display device may include a pixel and a light shutter. The pixel may include a first region and a second region. The light shutter may be disposed in the second region. The light shutter may include a first electrode, a heat generation layer disposed on the first electrode, and a phase change layer disposed on the heat generation layer. The phase change layer may include a phase change material of which optical property is changed depending on temperature.

19 Claims, 7 Drawing Sheets (56) References Cited

U.S. PATENT DOCUMENTS

2011/0233503 A1* 9/2011 Hwang ............... H01L 27/2409
257/2
2015/0098032 A1* 4/2015 Park ..................... G02F 1/0147
349/21
2017/0031231 A1* 2/2017 Bhaskaran ............ G02F 1/0147

* cited by examiner

DISPLAY DEVICE

CROSS-REFERENCE TO RELATED APPLICATION(S)

This application claims priority under 35 USC § 119 to Korean Patent Application No. 10-2016-0002890, filed on Jan. 8, 2016 in the Korean Intellectual Property Office (KIPO), the entire disclosure of which is incorporated by reference herein.

BACKGROUND

1. Field

Example embodiments relate to display devices. More particularly, example embodiments relate to transparent display devices including light shutters.

2. Description of the Related Art

A display device has been used as information delivery media. A demand for the display device has increased recently with the popularity of televisions, computers, tablets, and smart phones. A conventional display device has an opaque screen that displays images to one direction. Recently, a transparent display device including a transparent window and capable of transmitting an image of an object (or a target) located on the back side of the display device through the transparent window has been developed.

In general, each pixel included in the transparent display device has a display region and a light transmission region, and an object located on the back side of the display device may be seen through the light transmission region that is adjacent to the display region and transmits light.

However, due to the transparency of the light transmission region of the transparent display device, an image of the display region may be distorted, and a user may not clearly recognize the image of the display region. In addition, when the background of the transparent display device is brighter than an image of the transparent display device, the image of the display region may be invisible.

SUMMARY

Example embodiments provide a display device capable of selectively transmitting or blocking an incident light.

According to example embodiments, a display device may include a pixel and a light shutter. The pixel may include a first region and a second region. The light shutter may be disposed in the second region. The light shutter may include a first electrode and a phase change layer disposed on the first electrode. The phase change layer may include a phase change material of which optical property may be changed depending on temperature.

In example embodiments, the light shutter may further include a heat generation layer disposed between the first electrode and the phase change layer.

In example embodiments, the first region may be a light emission region, and the second region may be a light transmission region which does not emit light.

In example embodiments, the pixel may include an organic light emitting structure disposed in the first region. The organic light emitting structure may include an anode, an organic light emitting layer disposed on the anode, and a cathode disposed on the organic light emitting layer.

In example embodiments, the first electrode and the anode may be disposed on substantially the same level.

In example embodiments, the light shutter may further include a second electrode disposed on the phase change layer. The second electrode may be electrically connected to the cathode.

In some example embodiments, both of the first region and the second region may be a light emission region and, at the same time, a light transmission region.

In some example embodiments, the pixel may include a liquid crystal structure disposed in the first region and the second region.

In some example embodiments, the liquid crystal structure may include a pixel electrode, a liquid crystal layer disposed on the pixel electrode, and a common electrode disposed on the liquid crystal layer.

In example embodiments, the phase change material may be a chalcogenide based material.

In example embodiments, the phase change material may include germanium-antimony-tellurium (Ge—Sb—Te).

In example embodiments, each of the phase change layer and the heat generation layer may be doped with at least one of carbon, nitrogen, and oxygen.

In example embodiments, a crystallization state of the phase change material may be changed depending on the temperature. A light transmittance of the phase change layer may be changed depending on the crystallization state of the phase change material.

In example embodiments, the display device may further include a signal line. The first electrode may be electrically connected to the signal line.

In example embodiments, the display device may further include a plurality of light shutters. All of the plurality of light shutters may collectively transmit or block external light incident into the second region.

In some example embodiments, the display device may further include a first signal line, a second signal line each perpendicular to the first signal line, and a switching element electrically connected to the first signal line and the second signal line. The first electrode may be electrically connected to the switching element.

In some example embodiments, the display device may further include a plurality of light shutters. Each of the plurality of light shutters may separately transmit or block external light incident into the second region.

In example embodiments, a first signal for transmitting external light incident into the second region or a second signal for blocking the external light may be transferred to the first electrode.

In example embodiments, each of the first signal and the second signal may be generated based on luminance of a background of the display device.

In some example embodiments, each of the first signal and the second signal may be generated based on selection of a user of the display device.

According to example embodiments, the display device may include the light shutter disposed in the second region, and the light shutter may include the first electrode, the heat generation layer and the phase change layer including the phase change material of which optical property may be changed depending on the temperature. Thus, the display device may transmit or block the external light incident into the second region. Therefore, the display device may serve as a transparent display device that transmits the external light for a user to watch an object located on the rear side of the display device, or as an opaque display device that blocks the external light to increase visibility of an image from the display device.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, display devices in accordance with example embodiments will be explained in detail with reference to the accompanying drawings.

Figure 1:
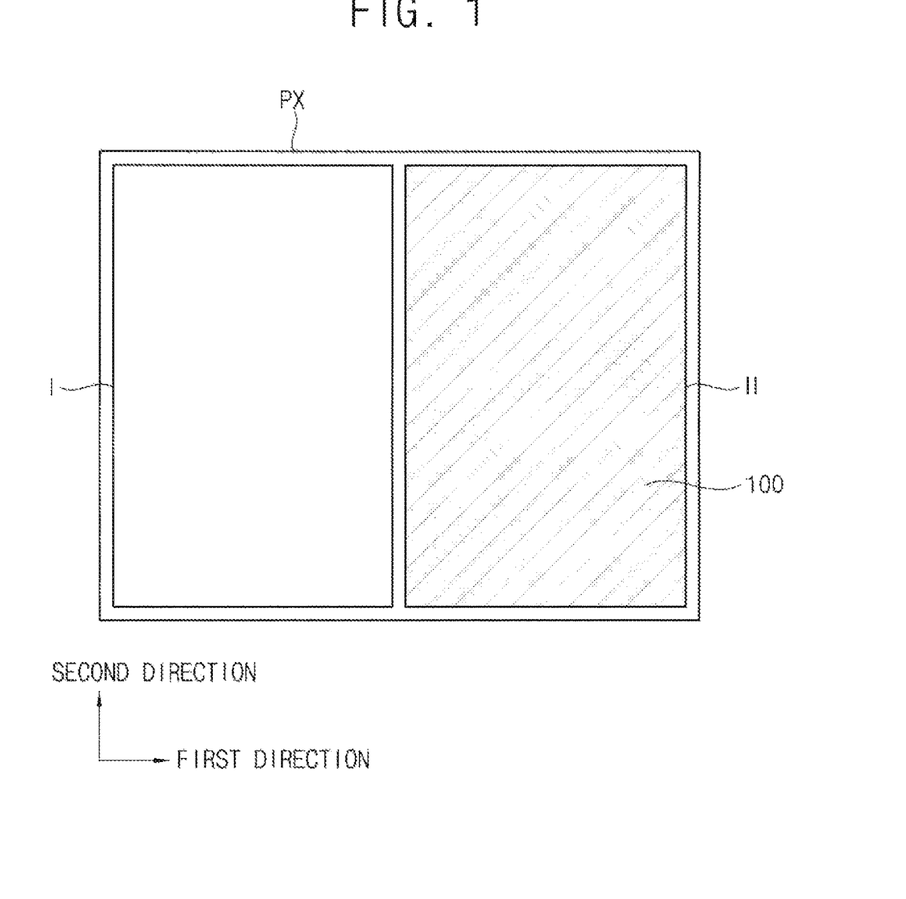
FIG. 1 is a plan view illustrating a display device in accordance with example embodiments.
Figure 2:
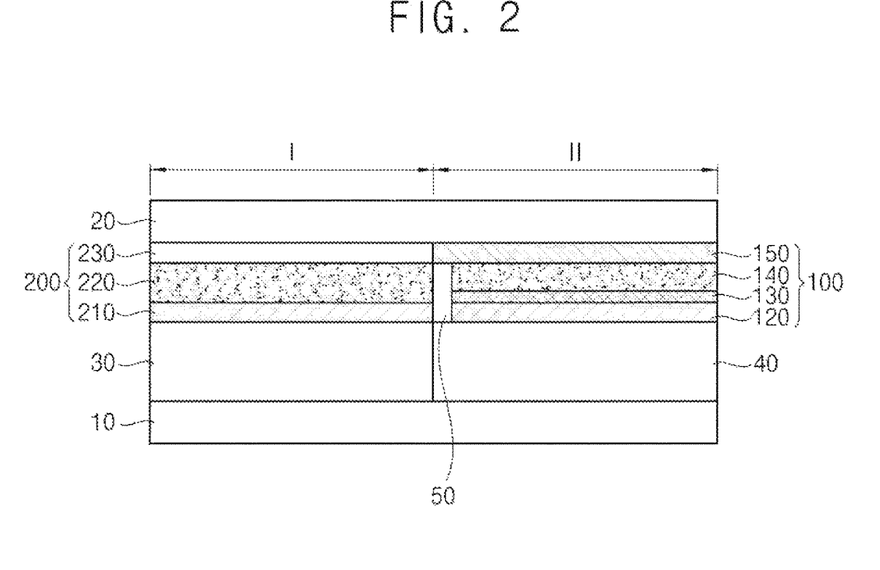
FIG. 2 is a cross-sectional view illustrating a display device in accordance with example embodiments.

FIG. 1 is a plan view illustrating a display device in accordance with example embodiments. FIG. 2 is a cross-sectional view illustrating a display device in accordance with example embodiments.

Referring to FIGS. 1 and 2, a display device may include a plurality of pixels PX and a plurality of light shutters 100 which are disposed on a first substrate 10.

Although, FIG. 1 illustrates only one pixel PX, the display device may include the plurality of pixels PX that are periodically arranged. For example, the plurality of pixels PX may be arranged as a substantial matrix configuration. In example embodiments, each of the pixels PX may respectively emit red light, green light, or blue light, and three pixels PX may compose one pixel group. In some example embodiments, each of the pixels PX may respectively emit red light, green light, blue light, or white light, and four pixels PX may compose one pixel group.

The display device may further include a plurality of scan lines, a plurality of data lines, a plurality of power supply lines, etc. The scan lines may extend along a first direction and may transfer scan signals to the pixels PX. The data lines may extend along a second direction substantially perpendicular to the first direction and may transfer data signals to the pixels PX. The power supply lines may extend along the second direction and may transfer power voltage to the pixels PX.

Each of the pixels PX may include a first region I and a second region II. Each of the first region I and the second region II may have a substantially rectangular plane shape as illustrated in FIG. 1. However, the shape of each of the first region I and the second region II may be not limited thereto. For example, each of the first region I and the second region II may have various plane shapes such as a substantially oval shape, a substantially circular shape, a substantially polygonal shape, etc.

In example embodiments, the first region I may be a light emission region, and the second region II may be a light transmission region which does not emit light. A display structure for emitting light may be disposed in the first region I, and light (e.g., red light, green light, or blue light) may be emitted from the display structure. Light for displaying an image may be not emitted from the second region II, and the second region II may serve as the light transmission region that transmits external light incident into the second region II from a front side or a rear side of the display device. Therefore, a user may recognize an object located at the front side or the rear side of the display device. A light transmittance of the display device may be changed depending on the size of the second region II.

The first substrate 10 may include a transparent material that transmits light. For example, the first substrate 10 may include triacetyl cellulose (TAC), polycarbonate (PC), polyethersulfone (PES), polyethylene terephthalate (PET), polyethylene naphthalate (PEN), polyvinyl alcohol (PVA), polymethyl methacrylate (PMMA), and/or cyclic olefin polymer (COP).

A pixel circuit 30 may be disposed on the first substrate 10 in the first region I. The pixel circuit 30 may drive organic light emitting structure 200 disposed thereon. The pixel circuit 30 may be included in each of the pixels PX. The pixel circuit 30 may include a driving transistor, a switching transistor, a capacitor, etc. For example, a voltage that corresponds to a difference between a data voltage and a reference voltage may be charged in the capacitor that is coupled between a gate electrode and a source electrode of the driving transistor, and the driving transistor may be operated by the charged voltage.

In example embodiments, a first, a second, and a third active patterns may be disposed on the first substrate 10, and a gate insulation layer may be disposed on the first substrate 10 to cover the active patterns. A first, a second and a third gate electrodes which respectively overlap the first, the second, and the third active patterns may be disposed on the gate insulation layer, and an insulation interlayer may be disposed on the gate insulation layer and the gate electrodes. A first and a second source electrodes, and a first and a second drain electrodes may be disposed on the insulation interlayer, and a via insulation layer may be disposed on the insulation interlayer to cover the source electrodes and the drain electrodes. The driving transistor may include the first active pattern, the first gate electrode, the first source electrode, and the first drain electrode. The switching transistor may include the second active pattern, the second gate electrode, the second source electrode, and the second drain electrode. The capacitor may include the third active pattern and the third gate electrode.

The organic light emitting structure 200 may be disposed on the pixel circuit 30 in the first region I. The organic light emitting structure 200 may emit light for displaying an image based on driving currents transferred through the driving transistor. Here, the display device may be an organic light emitting display device.

In example embodiments, the organic light emitting structure 200 may include an anode 210, an organic light emitting layer 220, and a cathode 230.

The anode 210 may be patterned in each of the pixels PX, and a pixel defining layer may be formed to surround the anode 210. The pixel defining layer may overlap an edge portion of the anode 210 to expose a center portion of the anode 210. The anode 210 may be electrically connected to the driving transistor of the pixel circuit 30.

In an example embodiment, the anode 210 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or an alloy thereof. In another example embodiment, the anode 210 may include a transparent conductive material such as indium tin oxide (ITO), indium zinc oxide (IZO), etc. In still another example embodiments, the anode 210 may have a multi-layer structure including the metal and the transparent conductive material.

The organic light emitting layer 220 may be formed on the anode 210 to overlap the exposed center portion of the anode 210. The cathode 230 may be formed on the organic light emitting layer 220. In an example embodiment, the cathode 230 may be disposed in the first region I and the second region II. In another example embodiment, the cathode 230 may not be disposed in the second region II to increase a light transmittance in the second regions II of the display device.

An insulation layer 40 may be disposed on the first substrate 10 in the second region II. The insulation layer 40 may prevent vapor from permeating through the first substrate 10 and impurities from diffusing between the first substrate 10 and structures thereon. The insulation layer 40 may alleviate stress generated from the structures. In example embodiments, the gate insulation layer, the insulation interlayer and the via insulation layer may extend to the second region II to form the insulation layer 40.

The light shutter 100 may be disposed on the insulation layer 40 in the second region II. The light shutter 100 may include a first electrode 120, a heat generation layer 130 and a phase change layer 140. In example embodiments, the light shutter 100 may further include a second electrode 150.

The first electrode 120 may be formed on the insulation layer 40. The first electrode 120 may include a transparent conductive material (e.g., ITO, IZO, etc.) to have a high electrical conductivity and a high light transmittance. Alternatively, the first electrode 120 may include a metallic mesh shape using silver (Ag), copper (Cu), aluminum (Al), and alloy thereof.

In example embodiments, the first electrode 120 of the light shutter 100 and the anode 210 of the organic light emitting structure 200 may be disposed at substantially the same level over the first substrate 10. For example, when the anode 210 includes the transparent conductive material, the transparent conductive material may be formed in the first region I and the second region II to simultaneously form the anode 210 and the first electrode 120. Therefore, an additional process to form the first electrode 120 may be not required.

The heat generation layer 130 may be formed on the first electrode 120. Current or voltage may be applied to the first electrode 120 which contacts the heat generation layer 130, and the heat generation layer 130 may be joule-heated by electrical energy from the applied current or voltage, thereby heating the phase change layer 140 on the heat generation layer 130. In example embodiments, the heat generation layer 130 may include any one of titanium nitride (TiN), titanium oxynitride (TiON), titanium aluminum nitride (TiAlN), titanium silicon nitride (TiSiN), tantalum aluminum nitride (TaAlN), tantalum silicon nitride (TaSiN), and silicon germanium (SiGe). The heat generation layer 130 may be formed in a metallic mesh shape so that light can be transmitted therethrough. However, the example embodiments is not limited thereto, and the heat generation layer 130 may have various materials, shapes, and structures.

The phase change layer 140 may be formed on the heat generation layer 130. The phase change layer 140 may include a phase change material of which optical property is changed depending on temperature. The heat generation layer 140 may be formed by a sputtering method.

The crystallization state of the phase change material may be changed depending on temperature, and transmittance and reflectivity of light may be changed depending on the crystallization state. Specifically, the phase change material may become an amorphous state at a high temperature, and may become a crystalline state at a low temperature. The phase change material may have a response speed of a nanosecond or so, which is a very fast response speed. The phase change material may be driven with low power. For example, the response speed of the phase change layer 140 may be about 30 nanoseconds (ns) to about 1 microsecond ($\mu$s), and the driving current for the phase change layer 140 may be about 50 microamperes ($\mu$A) to about 2 milliamperes (mA).

In example embodiments, the phase change material may be a chalcogenide based material that may be joule-heated by the current or the voltage applied through the first electrode 120. The phase change material may include germanium-antimony-tellurium (Ge—Sb—Te). The material including Ge—Sb—Te may become the amorphous state at a predetermined temperature or above, and may become the crystalline state at the predetermined temperature or below. Here, the crystalline state may be an opaque state in which light may not be transmitted, and the amorphous state may be a transparent state in which light may be transmitted. Thus, if the material including Ge—Sb—Te is used, light transmittance may be controlled based on the temperature of the material. Generally, the material including Ge—Sb—Te may change the phase thereof at a temperature of about 500 degrees Celsius (° C.) to about 600° C. However, the reference temperature of the phase change may be changed depending on the specific composition of the material. The phase change material including Ge—Sb—Te may have the structure of a compound or alloy. For example, the compound may include $Ge_2Sb_2T_5$ as a ternary compound, (GeSn)SbTe, GeSb(SeTe) as a quaternary compound, etc.

Although a material including Ge—Sb—Te is used as the phase change material in the example embodiments, the present invention may not be limited thereto. In example embodiments, the phase change material may be used without limitation as long as it is a material of which light transmittance may be changed depending on temperature. The heat generation layer 130 and the phase change layer 140 may be doped with at least one of carbon, nitrogen, and oxygen so that the electrical or optical property of the phase change material may be changed in accordance with the doping level. The optical property of the phase change material will be described with reference to FIGS. 4A to 4C.

The second electrode 150 may be formed on the phase change layer 140. The second electrode 150 may include a transparent conductive material (e.g., ITO, IZO, etc.) to have a high electrical conductivity and a high light transmittance. Alternatively, the second electrode 150 may include a metallic mesh shape using silver (Ag), copper (Cu), aluminum (Al), and alloy thereof.

In example embodiments, the second electrode 150 may be electrically connected to the cathode 230. In this case, electrical resistance of the cathode 230 may be reduced, thereby decreasing resistive-capacitive (RC) delay of the cathode 230.

A sidewall 50 may be formed on the insulation layer 40 to substantially surround the light shutter 100. The sidewall 50 may prevent materials from moving from the light shutter 100 and may prevent the light shutter 100 from being contaminated.

The second substrate 20 may be an upper substrate opposite to the first substrate 10. The second substrate 20 may be disposed on the cathode 230 and the second electrode 150. The second substrate 20 may include a transparent material through which light may be transmitted like the first substrate 10. For example, the second substrate 20 may include triacetyl cellulose, polycarbonate, polyethersulfone, polyethylene terephthalate, polyethylene naphthalate, polyvinyl alcohol, polymethyl methacrylate, and/or cyclic olefin polymer.

Figure 3:
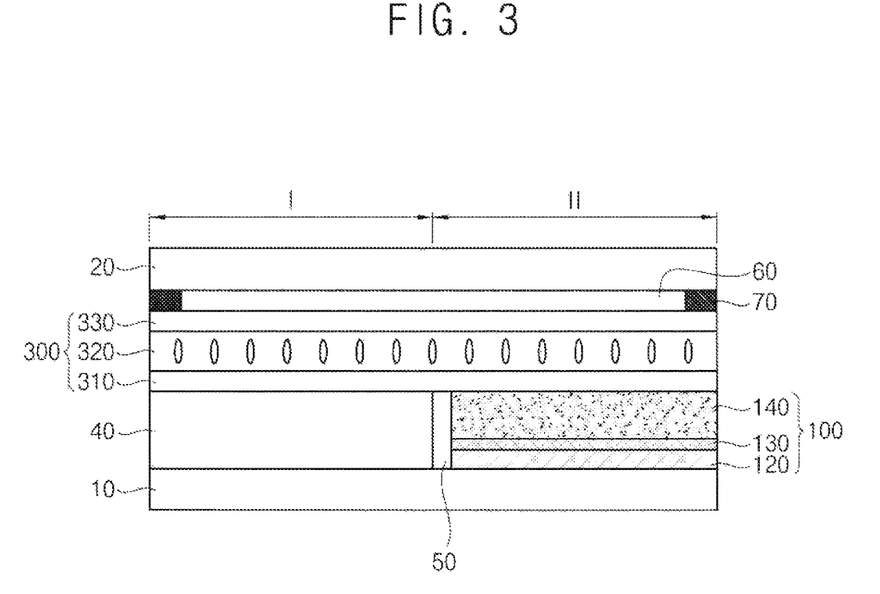
FIG. 3 is a cross-sectional view illustrating a display device in accordance with some example embodiments.

FIG. 3 is a cross-sectional view illustrating a display device in accordance with some example embodiments.

Referring to FIGS. 1 and 3, a display device may include a plurality of pixels PX and a plurality of light shutters 100 which are disposed on a first substrate 10. Detailed description on elements of the display device in FIG. 3 which are substantially the same or similar to those with reference to FIG. 2 may be not repeated.

In example embodiments, both of the first region I and the second region II may be a light emission region and, at the same time, a light transmission region. A display structure for emitting light may be disposed in the first region I and the second region II, thereby emitting light (e.g., red light, green light, or blue light). The first region I and the second region II may also serve as the light transmission region that transmits external light incident into the first and the second regions I and II from a front side or a rear side of the display device. Therefore, a user may recognize an object located at the front side or the rear side of the display device.

A pixel circuit (not shown) and an insulation layer 40 may be disposed on the first substrate 10, and the insulation layer 40 may be disposed on the first region I. In example embodiments, the pixel circuit may be located to overlap a black matrix 70. The pixel circuit may drive a liquid crystal structure 300. The pixel circuit may be disposed at each of the pixels PX. The pixel circuit may include a switching transistor, a capacitor, etc. For example, a voltage corresponding to a difference between a data voltage and a reference voltage may be charged on the capacitor that is coupled between a gate electrode and a source electrode of the switching transistor. The switching transistor may be driven by the charged voltage.

The light shutter 100 may be disposed on the first substrate 10 in the second region II. The light shutter 100 may include a first electrode 120, a heat generation layer 130 and a phase change layer 140.

In example embodiments, the light shutter 100 and the insulation layer 40 may be disposed at substantially the same level over the first substrate 10. In other words, the light shutter 100 may be disposed under the liquid crystal structure 300.

The liquid crystal structure 300 may be disposed on the insulation layer 40 and the light shutter 100 in the first region I and the second region II. In example embodiments, the liquid crystal structure 300 may include a pixel electrode 310, a liquid crystal layer 320, and a common electrode 330. Here, the display device may be a liquid crystal display device.

The pixel electrode 310 may be patterned in each of the pixels PX. The liquid crystal layer 320 and the common electrode 330 may not be patterned in each of the pixels PX and may be formed over a substantial entirety of the first substrate 10. The pixel electrode 310 may be electrically connected to the switching transistor of the pixel circuit.

A color filter 60 and a black matrix 70 may be formed on a second substrate 20 opposite to the first substrate 10. The color filter 60 and the black matrix 70 may be formed to correspond to the pixel electrode 310 in order to define the emission region. An overcoat layer may be formed between the color filter 60 and the black matrix 70, and the common electrode 330.

Figure 4A:
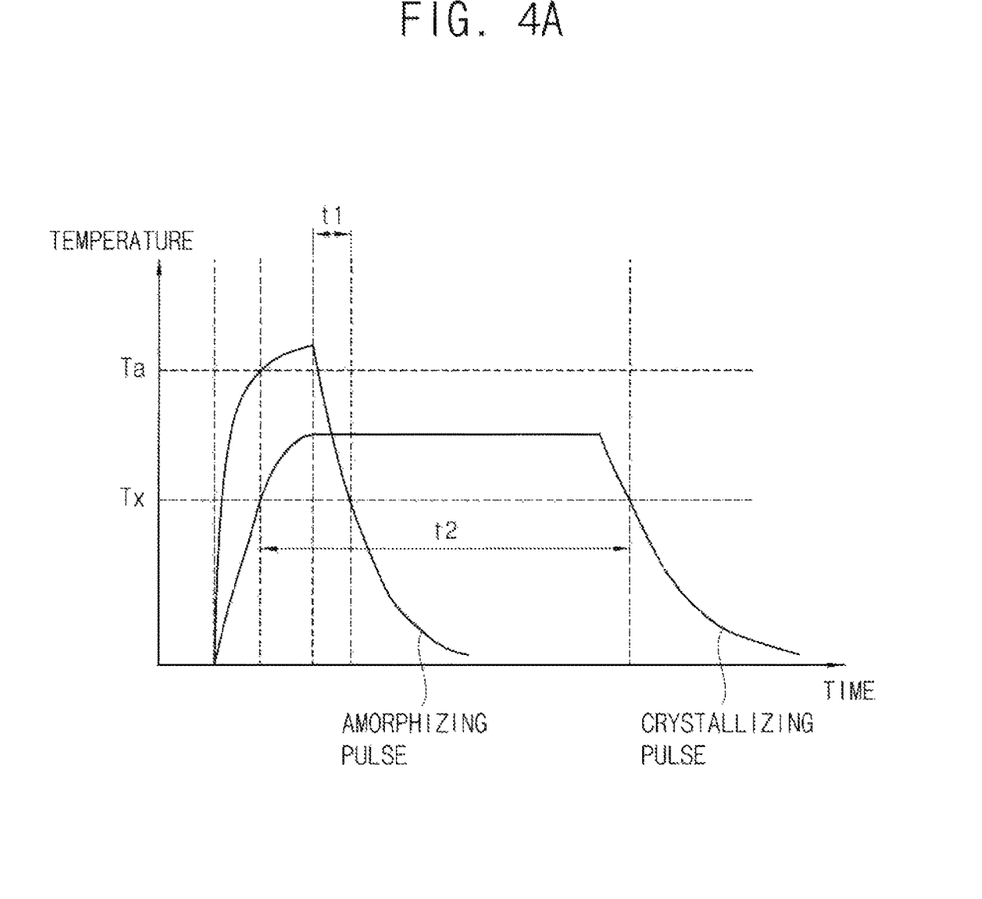
FIGS. 4A, 4B, and 4C are diagrams illustrating changes in optical property of a phase change material.
Figure 4B:
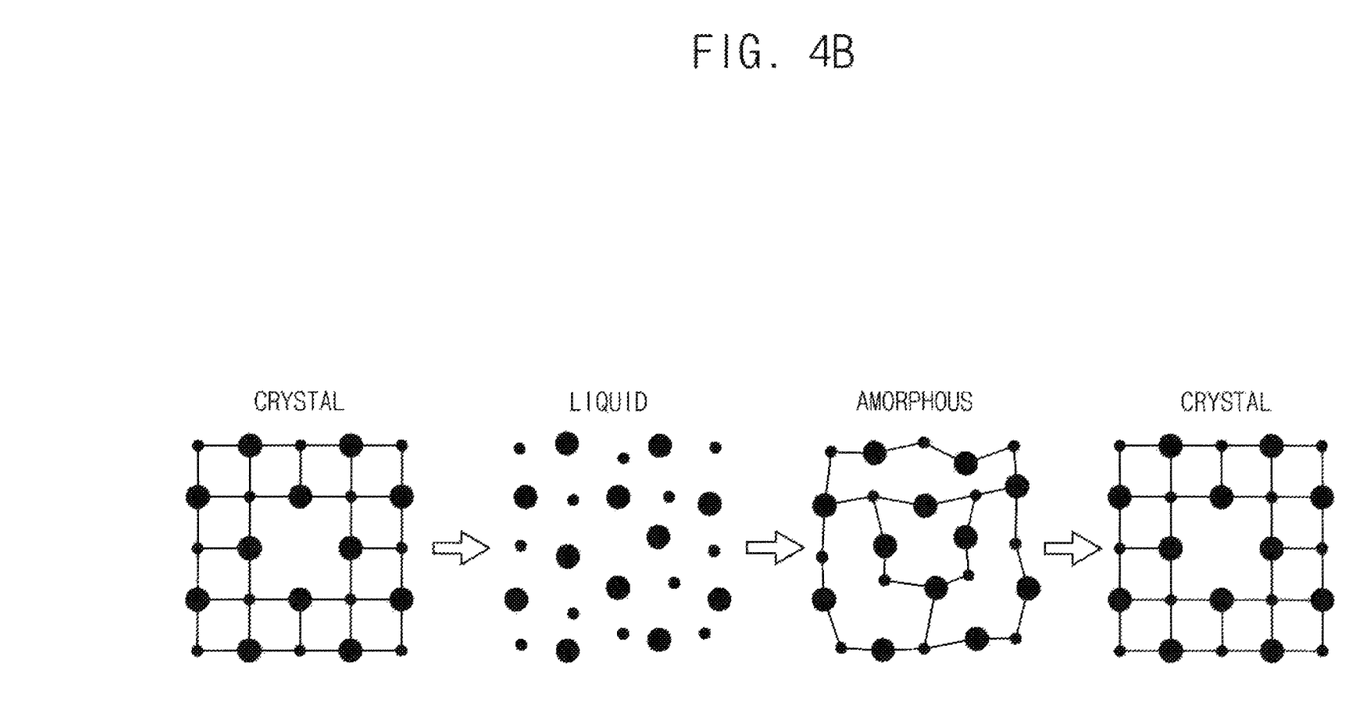
Figure 4C:
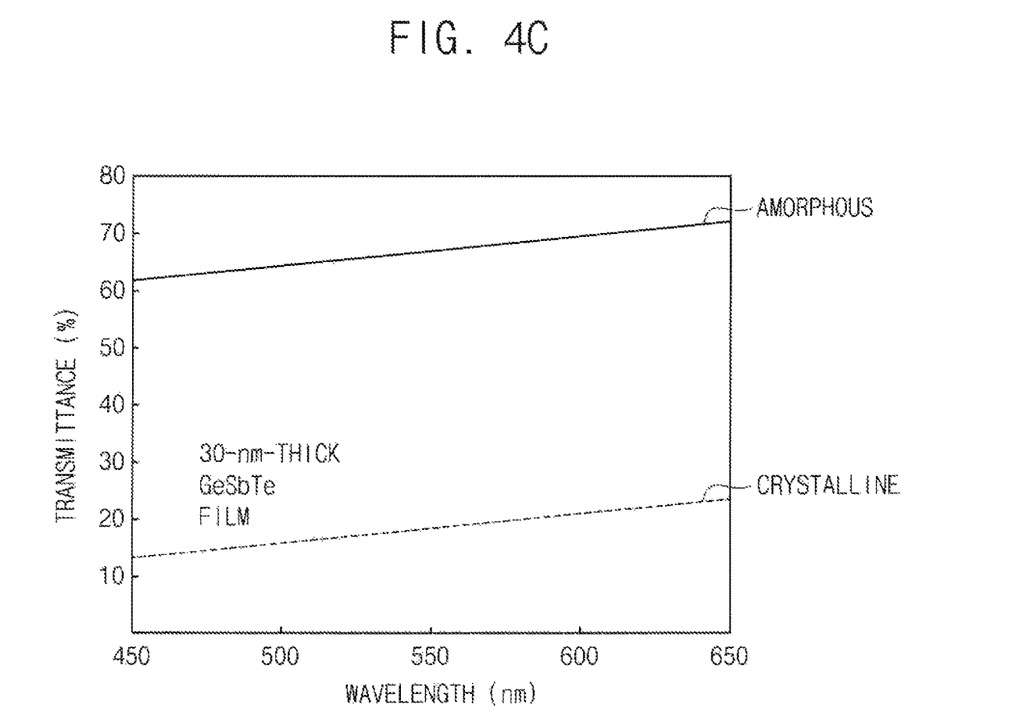

FIGS. 4A, 4B and 4C are diagrams illustrating changes in optical property of a phase change material.

FIG. 4A is a graph illustrating a method of applying a pulse to the phase change material. FIG. 4B is a diagram illustrating transition conditions between a crystalline state and an amorphous state of the phase change material. FIG. 4C is a graph illustrating light transmittances of the crystalline state and the amorphous state.

If a voltage is applied to the first electrode 120, the heat generation layer 130 may radiate heat. If the heat generation layer 130 radiates heat, temperature of the phase change layer 140 may increase, thereby causing a phase change of the phase change layer 140. Specifically, if current with an intense and short amorphizing pulse is applied to the first electrode 120 so that the phase change material of the phase change layer 140 is heated to a melting temperature Ta or above, the phase change material may become a liquid state. The amorphizing pulse may require a very short pulse for the purpose of rapid cooling after the phase change material 220 became a liquid state. In this case, just after the phase change material is heated to a melting temperature Ta or above, the phase change material may be rapidly cooled to a crystallization temperature Tx or below in a short time, for example, during a first time t1 after the termination of the amorphizing pulse, so that the phase change material may be changed into an amorphous state. Since light transmittance of the phase change material is relatively high in the amorphous state, light incident onto the phase change layer 140 may be transmitted.

Meanwhile, if current with a crystallizing pulse of which intensity is less than the amorphizing pulse and duration is greater than the amorphizing pulse is applied to the first electrode 120 so that the phase change material is heated to a temperature between the melting temperature Ta and the crystallization temperature Tx, atoms of the phase change material may be rearranged so that the phase change material may be changed into a crystalline state. The crystallizing pulse may require a long pulse in order that the phase change material remains in the crystallization temperature Tx or above and below the melting temperature Ta. The phase change material may require to be cooled in a relatively long time while being maintained in the crystallization temperature Tx or above for a second time t2. Since light transmittance of the phase change material is relatively low in the crystalline state, light incident onto the phase change layer 140 may be blocked. In such a manner, the light shutter 100 may control the transmittance of light.

Figure 5:
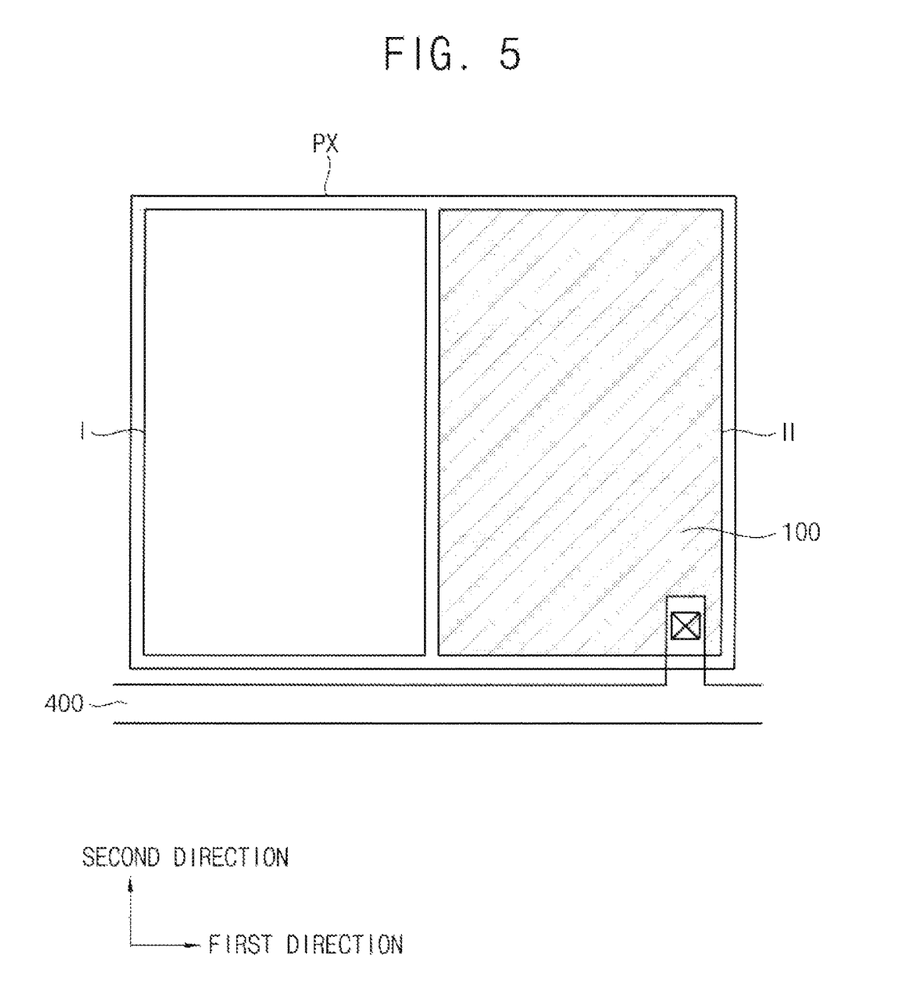
FIG. 5 is a plan view illustrating a display device in accordance with example embodiments.

FIG. 5 is a plan view illustrating a display device in accordance with an example embodiment.

Referring to FIG. 5, a display device may include a plurality of pixels PX, a plurality of light shutters 100, and a plurality of signal lines 400.

Each of the signal lines 400 may be disposed adjacent to the pixels PX. Specifically, each of the signal lines 400 may extend along a first direction (or along a second direction substantially perpendicular to the first direction), thereby being disposed adjacent to the pixels PX that are arranged along the first direction (or along the second direction).

The signal lines 400 may include aluminum (Al) based metal such as Al or Al alloy, silver (Ag) based metal such as Ag or Ag alloy, copper (Cu) based metal such as Cu or Cu alloy, molybdenum (Mo) based metal such as Mo or Mo alloy, chrome (Cr), tantalum (Ta) or titanium (Ti).

In example embodiments, the signal lines 400 may have a multi-layered structure including two conductive layers having different physical properties. One of the two conductive layers may include metal having low resistivity, e.g., Al based metal, Ag based metal, Cu based metal or the like in order to reduce a signal delay or voltage drop. The other conductive layer may include another material particularly a material having excellent physical, chemical, and electrical contact characteristics with indium tin oxide (ITO) and indium zinc oxide (IZO). For example, the other conductive layer may include Mo based metal, Cr, Ta, Ti or the like.

The signal lines 400 may be electrically connected to the first electrode 120 of the light shutter 100. For example, the signal line 400 may be connected to the first electrode 120 through a contact hole. The signal line 400 may supply an electrical signal to the first electrode 120. The electrical signal may include a first signal S1 and a second signal S2. The first signal S1 may be a signal for transmitting external light incident into the second region II. The second signal S2 may be a signal for blocking the external light.

In example embodiments, as described above, the first signal S1 may be the amorphizing pulse for changing the phase change material to the amorphous state, and the second signal S2 may be the crystallizing pulse for changing the phase change material to the crystalline state. Therefore, a light transmittance of the phase change material may be increased when the first signal S1 is applied to the first electrode 120 through the signal line 400, and the light transmittance of the phase change material may be decreased when the second signal S2 is applied to the first electrode 120 through the signal line 400.

In example embodiments, the first signal S1 and the second signal S2 may be generated based on a background of the display device. In some cases, a luminance of the background of the display device may be greater than that of an image of the display device when the display device displays the image. In this case, a user may not recognize the image of the display device. Therefore, the display device may supply the second signal S2 to the light shutter 100, and may block external light incident into the second region II of the pixel PX so as to increase visibility of the image. For this purpose, the display device may include a light sensing member (e.g., a light sensor) that senses luminance of the external light.

In some example embodiments, the first signal S1 and the second signal S2 may be generated based on a selection of the user of the display device. The user may use the display device as a glass window without watching an image, as a display means for only watching the image, or a display means for watching the image as well as watching an object located on the rear side of the display device. Therefore, based on the selection of the user, the display device may supply the first signal S1 to the light shutter 100 so that external light incident into the second region II of the pixel PX may be transmitted, or may supply the second signal S2 to the light shutter 100 so that the external light incident into the second region II of the pixel PX may be blocked.

In example embodiments, all of the light shutters 100 may collectively transmit or block the external light incident into the second region II. Specifically, all of the light shutters 100 disposed in the second region II of the plurality of pixels PX may receive substantially the same electrical signal so that a plurality of external lights incident into a plurality of the second regions II may be collectively transmitted or blocked.

As described in FIG. 5, the pixels PX arranged along the first direction may be connected to one of the signal lines 400 which extend along the first direction, and the pixels PX may receive substantially the same electrically signal. Additionally, the signal lines 400 extending along the first direction may receive substantially the same electrically signal from a light shutter driver. Therefore, the first and the second signals S1 and S2 may be collectively applied to all of the light shutters 100, so that all of the light shutters 100 of the display device may collectively transmit or block the external light incident into the second regions II.

Figure 6:
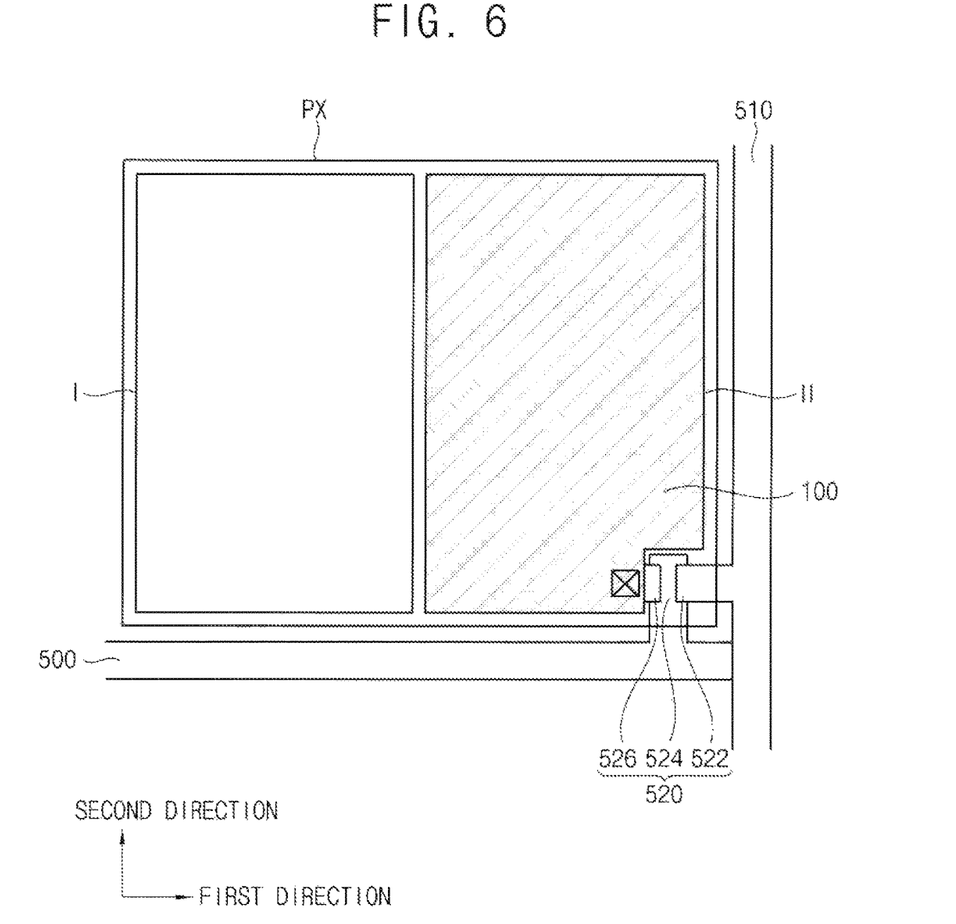
FIG. 6 is a plan view illustrating a display device in accordance with some example embodiments.

FIG. 6 is a plan view illustrating a display device in accordance with some example embodiments.

Referring to FIG. 6, a display device may include a plurality of pixels PX, a plurality of light shutters 100, a plurality of first signal lines 500, a plurality of second signal lines 510, and a plurality of switching elements 520.

Each of the first signal lines 500 may be disposed adjacent to the pixels PX. Specifically, each of the first signal lines 500 may extend along a first direction, thereby being disposed adjacent to the pixels PX that are arranged along the first direction.

The first signal lines 500 may include aluminum (Al) based metal such as Al or Al alloy, silver (Ag) based metal such as Ag or Ag alloy, copper (Cu) based metal such as Cu or Cu alloy, molybdenum (Mo) based metal such as Mo or Mo alloy, chrome (Cr), tantalum (Ta) or titanium (Ti).

In one example embodiment, the first signal lines 500 may have a multi-layered structure including two conductive layers having different physical properties. One of the two conductive layers may include metal having low resistivity, e.g., Al based metal, Ag based metal, Cu based metal or the like in order to reduce a signal delay or voltage drop. The other conductive layer may include another material particularly a material having excellent physical, chemical and electrical contact characteristics with indium tin oxide (ITO) and indium zinc oxide (IZO). For example, the other conductive layer may include Mo based metal, Cr, Ta, Ti or the like.

Each of the second signal lines 510 may be disposed adjacent to the pixels PX. Specifically, each of the second signal lines 510 may extend along a second direction substantially perpendicular to the first direction, thereby being disposed adjacent to the pixels PX that are arranged along the second direction. The second signal lines 510 may include substantially the same material as that of the first signal lines 500.

Each of the switching elements 520 may be electrically connected to each of the first signal lines 500 and each of the second signal lines 510. Additionally, an electrode of the switching element 520 may electrically connected to the first electrode 120 of the light shutter 100. For example, the electrode of the switching element 520 may be connected to the first electrode 120 through a contact hole.

In an example embodiment, the switching element 520 may be a thin film transistor (TFT) that is turned-on in response to a signal applied from the first signal line 500 and applies an electrical signal to the first electrode 120. Specifically, the switching element 520 may include a gate electrode 524, a channel layer (not shown) disposed on the gate electrode 524, and source and drain electrodes 522 and 526 which are disposed on the channel layer. For example, the gate electrode 524 may be connected to the first signal line 500, the source electrode 522 may be connected to the second signal line 510, and the drain electrode 526 may be connected to the first electrode 120 of the light shutter 100.

The first signal line 500 may supply the signal for turning-on the switching element 520 to the gate electrode 524 of the switching element 520. The second signal line 510 may supply the electrical signal to the source electrode 522 of the switching element 520. The electrical signal may include a first signal S1 and a second signal S2. The first signal S1 may be a signal for transmitting external light incident into the second region II. The second signal S2 may be a signal for blocking the external light.

In example embodiments, as described above, the first signal S1 may be the amorphizing pulse for changing the phase change material to the amorphous state, and the second signal S2 may be the crystallizing pulse for changing the phase change material to the crystalline state. Therefore, a light transmittance of the phase change material may be increased when the first signal S1 is applied to the first electrode 120 through the second signal line 510, and the light transmittance of the phase change material may be decreased when the second signal S2 is applied to the first electrode 120 through the second signal line 510.

In example embodiments, the first signal S1 and the second signal S2 may be generated based on a background of the display device. In some cases, a luminance of the background of the display device may be greater than that of an image of the display device when the display device displays the image. In this case, a user may not recognize the image of the display device. Therefore, the display device may generate the second signal S2 to apply to the light shutter 100, and may block external light incident into the second region II of the pixel PX so as to increase visibility of the image. For this purpose, the display device may include a light sensing member (e.g., a light sensor) that senses luminance of the external light.

In some example embodiments, the first signal S1 and the second signal S2 may be generated based on a selection of the user of the display device. The user may use the display device as a glass window without watching an image, as a display means for only watching the image, or a display means for watching the image as well as watching an object located on the bottom of the display device. Therefore, based on the selection of the user, the display device may supply the first signal S1 to the light shutter 100 so that external light incident into the second region II of the pixel PX may be transmitted, or may supply the second signal S2 to the light shutter 100 so that the external light incident into the second region II of the pixel PX may be blocked.

In example embodiments, each of the light shutters 100 may separately transmit or block the external light incident into the second region II. Specifically, each of the light shutters 100 disposed in the second region II of the pixels PX may receive substantially different electrical signal, so that some of the light shutters 100 may transmit the external light incident into the second region II, and the others may block the external light incident into the second region II.

As described in FIG. 6, the pixels PX arranged along the first direction may be connected to one of the first signal lines 500 which extend along the first direction, and the pixels PX may receive substantially the same turning-on signal. The first signal lines 500 extending along the first direction may sequentially receive the turning-on signal. Additionally, the pixels PX arranged along the second direction may be connected to one of the second signal lines 510 which extend along the second direction, and the second signal lines 510 may receive substantially different electrical signal. Therefore, the first and the second signals S1 and S2 may be separately applied to the light shutters 100, so that each of the light shutters 100 of the display device may separately transmit or block the external light incident into the second regions II.

The display device according to example embodiments may be applied to various electronic devices. For example, the display device may be applied to computers, notebooks, mobile phones, smart phones, smart pads, personal media players (PMP), personal digital assistance (PDA), MP3 players, digital cameras, video camcorders, etc.

Although a few example embodiments have been described, those skilled in the art will readily appreciate that many modifications are possible in the example embodiments without materially departing from the novel teachings and advantages of the present inventive concept.

What is claimed is:

1. A display device comprising:
   a pixel including a first region through which light for displaying an image is emitted and a second region which transmits external light incident into the second region from a front side or a rear side of the display device; and
   a light shutter disposed in the second region,
   wherein the light shutter comprises:
      a first electrode; and
      a phase change layer disposed on the first electrode, and
   wherein the phase change layer includes a phase change material of which optical property is changed depending on a temperature.

2. The display device of claim 1, wherein the light shutter further comprises a heat generation layer disposed between the first electrode and the phase change layer.

3. The display device of claim 2, wherein the phase change material is a chalcogenide based material.

4. The display device of claim 3, wherein the phase changes material includes germanium-antimony-tellurium (Ge—Sb—Te).

5. The display device of claim 4, wherein each of the phase change layer and the heat generation layer is doped with at least one of carbon, nitrogen, and oxygen.

6. The display device of claim 1, wherein the pixel comprises an organic light emitting structure disposed in the first region, and
   wherein the organic light emitting structure comprises:
      an anode;
      an organic light emitting layer disposed on the anode; and
      a cathode disposed on the organic light emitting layer.

7. The display device of claim 6, wherein the first electrode and the anode are disposed on a same level.

8. The display device of claim 6, wherein the light shutter further comprises a second electrode disposed on the phase change layer, wherein the second electrode is electrically connected to the cathode.

9. The display device of claim 1, wherein both of the first region and the second region are a light emission region and, at the same time, a light transmission region.

10. The display device of claim 9, wherein the pixel comprises a liquid crystal structure disposed in the first region and the second region.

11. The display device of claim 10, wherein the liquid crystal structure comprises:
    a pixel electrode;
    a liquid crystal layer disposed on the pixel electrode; and
    a common electrode disposed on the liquid crystal layer.

12. The display device of claim 1, wherein a crystallization state of the phase change material is changed depending on the temperature, and
    wherein a light transmittance of the phase change layer is changed depending on the crystallization state of the phase change material.

13. The display device of claim 1, further comprising a signal line,
    wherein the first electrode is electrically connected to the signal line.

14. The display device of claim 13, further comprising a plurality of light shutters,
   wherein all of the plurality of light shutters collectively transmit or block external light incident into the second region.

15. The display device of claim 1, further comprising:
   a first signal line;
   a second signal line perpendicular to the first signal line; and
   a switching element electrically connected to the first signal line and the second signal line,
   wherein the first electrode is electrically connected to the switching element.

16. The display device of claim 15, further comprising a plurality of light shutters,
   wherein each of the plurality of light shutters separately transmits or blocks external light incident into the second region.

17. The display device of claim 1, wherein a first signal for transmitting external light incident into the second region or a second signal for blocking the external light is transferred to the first electrode.

18. The display device of claim 17, wherein each of the first signal and the second signal is generated based on a luminance of a background of the display device.

19. The display device of claim 17, wherein each of the first signal and the second signal is generated based on a selection of a user of the display device.

* * * * *